(12) United States Patent
Wang et al.

(10) Patent No.: US 10,957,811 B2
(45) Date of Patent: Mar. 23, 2021

(54) ULTRA-BROAD SPECTRUM DETECTOR INTEGRATED WITH FUNCTIONS OF TWO-DIMENSIONAL SEMICONDUCTOR AND FERROELECTRIC MATERIAL

(71) Applicant: Shanghai Institute of Technical Physics, Chinese Academy of Sciences, Shanghai (CN)

(72) Inventors: Jianlu Wang, Shanghai (CN); Xudong Wang, Shanghai (CN); Hong Shen, Shanghai (CN); Tie Lin, Shanghai (CN); Xiangjian Meng, Shanghai (CN); Junhao Chu, Shanghai (CN)

(73) Assignee: Shanghai Institute of Technical Physics, Chinese Academy of Sciences, Shanghai (CN)

( * ) Notice: Subject to any disclaimer, the term of this patent is extended or adjusted under 35 U.S.C. 154(b) by 0 days.

(21) Appl. No.: 16/658,614

(22) Filed: Oct. 21, 2019

(65) Prior Publication Data
US 2020/0127155 A1   Apr. 23, 2020

(30) Foreign Application Priority Data
Oct. 22, 2018   (CN) .......................... 201811226478.0

(51) Int. Cl.
*H01L 21/00* (2006.01)
*H01L 31/113* (2006.01)
(Continued)

(52) U.S. Cl.
CPC ........ *H01L 31/1136* (2013.01); *H01L 29/516* (2013.01); *H01L 31/022408* (2013.01); *H01L 31/032* (2013.01)

(58) Field of Classification Search
CPC ........ H01L 31/02161; H01L 31/02167; H01L 31/022408; H01L 31/022425;
(Continued)

(56) References Cited

U.S. PATENT DOCUMENTS

| 6,737,689 B1* | 5/2004 | Schlosser .......... H01L 29/40111 257/295 |
| 9,685,215 B1* | 6/2017 | Kang .................. H01L 29/7391 |
| 9,853,150 B1* | 12/2017 | Colinge ............ H01L 29/40111 |

FOREIGN PATENT DOCUMENTS

CN   101405585 A   4/2009

OTHER PUBLICATIONS

First Office Action dated Oct. 30, 2019; China Application No. 201811226478.0; Filing Date: Oct. 22, 2018; 4 pages.
(Continued)

*Primary Examiner* — Richard A Booth
(74) *Attorney, Agent, or Firm* — Blank Rome LLP

(57) ABSTRACT

An ultra-broad spectrum detector integrated with functions of a two-dimensional semiconductor and a ferroelectric material, where the device includes a substrate, a two-dimensional semiconductor, a source electrode, a drain electrode, a ferroelectric material and a gate electrode; the two-dimensional semiconductor, the source electrode and the drain electrode are arranged on an upper surface of the substrate, and the source electrode and the drain electrode are respectively arranged at two ends of an upper surface of the two-dimensional semiconductor; two sides of the two-dimensional semiconductor are respectively connected with the lower-layer metal of the source electrode and the lower-layer metal of the drain electrode; the ferroelectric material is arranged on the upper surfaces of the two-dimensional semiconductor, the source electrode and the drain electrode;
(Continued)

and the lower surface of the gate electrode is connected with the upper surface of the ferroelectric material.

5 Claims, 19 Drawing Sheets

(51) Int. Cl.
*H01L 29/51* (2006.01)
*H01L 31/0224* (2006.01)
*H01L 31/032* (2006.01)

(58) Field of Classification Search
CPC ............... H01L 31/0272; H01L 31/032; H01L 31/1136; H01L 29/516
See application file for complete search history.

(56) References Cited

OTHER PUBLICATIONS

English translation First Office Action dated Oct. 30, 2019; China Application No. 201811226478.0; Filing Date: Oct. 22, 2018; 6 pages.
English translation; China Published Application No. CN101405585; Publication Date: Apr. 8, 2009; 10 pages.
Wang, Xudong et al., "Ultrasensitive and Broadband MoS2 Photodetector Driven by Ferroelectrics"; Advanced Materials 2015; www.advmat.de; 7 pages.
Notice of Allowance dated Apr. 15, 2020; China Application No. 201811226478.0; Filing Date: Oct. 22, 2018; 1 page.
English translation of allowed claims in the OEE application; China Application No. 201811226478.0; Filing Date: Oct. 22, 2018; 2 pages.

* cited by examiner

ULTRA-BROAD SPECTRUM DETECTOR INTEGRATED WITH FUNCTIONS OF TWO-DIMENSIONAL SEMICONDUCTOR AND FERROELECTRIC MATERIAL

RELATED APPLICATION

This application claims benefit of priority of China Patent Application No. 201811226478.0, filed Oct. 22, 2018, entitled: ULTRA-BROAD SPECTRUM DETECTOR INTEGRATED WITH FUNCTIONS OF TWO-DIMENSIONAL SEMICONDUCTOR AND FERROELECTRIC MATERIAL. The above-identified, related application is incorporated herein by reference in its entirety.

FIELD OF USE

The present invention relates to the field of photoelectric detection, and in particular to an ultra-broad spectrum detector integrated with functions of two-dimensional semiconductors and ferroelectrics.

BACKGROUND OF THE INVENTION

With the increasing demand for a two-color/multispectral photodetector in the fields of remote sensing, national defense, industry and so on, related detection technologies are developing in the directions of high sensitivity, broad spectrum, high resolution, low power consumption, miniaturization and intelligence. The two-color/multispectral photodetector can achieve detection in different wavelengths, multiplies the amount of system information and can acquire target information more accurately. During high-speed and accurate recognition of spatial distribution characteristics of the target object, key factors include a scale, a size, an operating speed and an operating temperature of a detector array. However, the traditional two-color/multi-waveband photodetector mostly utilizes an independent imaging detector, which need a larger size, a higher energy consumption and a higher cooling system requirement. Therefore, miniaturization and large-area array of an uncooled two-color/multi-waveband photodetector become an inevitable trend.

Recently, two-dimensional semiconductors show a great potential in the photoelectric detection application field due to their unique physical and optical characteristics. Compared with zero band gap graphene, most of transition metal dichalcogenides (TMDs) have a certain bandgap so as to belong to a typical semiconductor, and such material has unique advantages in the photoelectric field. However, due to limitations of background carrier concentration, mobility and the like, indexes, including photocurrent switching on/off ratio, photo-response time, detectivity and the like, of the TMDs cannot be conveniently and efficiently improved such that optical and electrical properties of the TMDs in a visible to near infrared waveband are limited. Additionally, due to limitations of a band gap, cutoff detection wavelengths of most of the TMDs only can reach the near infrared waveband so as to greatly limit application of the TMDs in a broad spectrum detection aspect. The size of the band gap can be regulated in a certain range by methods of changing the number of layers, stress, components and the like, for example, the detection wavelength of molybdenum disulfide ($MoS_2$) is expanded to 2717 nm by introducing defects in an atomic lattice of the $MoS_2$ by Ying Xie and the like. Although the detection wavelengths of the TMDs can be expanded to a certain extent by using a band gap regulation method, there still is a huge challenge when the single transition metal dichalcogenide is applied to be as a photosensitive element of a broad spectrum detector due to the fact that a low dimension characteristic of the single transition metal dichalcogenide limits improvement of its quantum efficiency.

The ferroelectric material is a dielectric material with spontaneous polarization, and its spontaneous polarization can change along with size and direction changes of an external electric field. Furthermore, the ferroelectric material also has the characteristics of excellent pyroelectricity, piezoelectricity and the like. Where a polyvinylidene fluoride (PVDF) polymer is a typical organic ferroelectric material, and is widely applied to the fields of ferroelectric nonvolatile memory, infrared detectors, sensors and the like due to its unique properties. Based on a pyroelectric effect, the ferroelectric material is widely applied to the field of uncooled infrared detectors, but such detector belongs to the field of thermal infrared technologies, and its responsivity and response time are incomparable with these of a photoconductive photodetector.

Combination of the two-dimensional semiconductor and the ferroelectric material is widely studied in the fields of storages, sensors, photodetectors and so on. For example, a two-dimensional semiconductor photodetector regulated by poly(vinylidenefluoride-trifluoroethylene) greatly improves the indexes, including responsivity, detectivity, photoresponse time, detection wavelength and the like, of the two-dimensional semiconductor under the action of a ferroelectric polarization electric field.

SUMMARY OF THE INVENTION

An objective of the present invention is to provide an ultra-broad spectrum detector integrated with functions of a two-dimensional semiconductor and a ferroelectric material capable of expanding a spectrum detection range.

To achieve the above objective, the present invention provides the following solution:

The present invention provides an ultra-broad spectrum detector integrated with functions of a two-dimensional semiconductor and a ferroelectric material, including a substrate 1, a two-dimensional semiconductor 2, a source electrode 3, a drain electrode 4, a ferroelectric material 5 and a gate electrode 6; where the two-dimensional semiconductor 2, the source electrode 3 and the drain electrode 4 are arranged on an upper surface of the substrate 1, and the source electrode 3 and the drain electrode 4 are respectively arranged at two ends of an upper surface of the two-dimensional semiconductor 2;

the source electrode 3 and the drain electrode 4 includes an upper-layer metal and a lower-layer metal, and the upper-layer metal is thicker than the lower-layer metal;

two sides of the two-dimensional semiconductor 2 are respectively connected with the lower-layer metal of the source electrode 3 and the lower-layer metal of the drain electrode 4;

the ferroelectric material 5 is arranged on the upper surfaces of the two-dimensional semiconductor 2, the source electrode 3 and the drain electrode 4; and the lower surface of the gate electrode 6 is connected with the upper surface of the ferroelectric material 5.

Optionally, the substrate 1 is an ultra-thin insulating substrate with a thickness thereof being less than 2 µm.

Optionally, the two-dimensional semiconductor 2 is a transition metal dichalcogenide semiconductor, and the two-dimensional semiconductor 2 has one to ten layers of molecules.

Optionally, the material of the source electrode 3 and the material of the drain electrode 4 are at least one of chromium, titanium, nickel, palladium, scandium, gold and platinum.

Optionally, the thickness of the lower-layer metal of the source electrode 3 is 5-15 nm, and the thickness of the upper-layer of the source electrode 3 is 30-50 nm.

Optionally, the ferroelectric material 5 is a polyvinylidene fluoride organic ferroelectric polymer, and the thickness of the ferroelectric material 5 is 300-1200 nm.

Optionally, the gate electrode 6 is a high-light-transmittance ultra-thin metal film and includes one of aluminum, chromium, titanium and nickel, and a light transmittance of the gate electrode 6 in an ultraviolet to long-wave infrared waveband is greater than 50%.

According to specific embodiments provided by the present invention, the present invention discloses the following technical effects: the present invention discloses an ultra-broad spectrum detector integrated with functions of a two-dimensional semiconductor and a ferroelectric material; In an ultraviolet to near infrared waveband, the two-dimensional semiconductor is the function layer and can generate high-sensitivity photoresponse to incident light in such waveband based on the photoconductive effect, the ferroelectric material is an auxiliary layer, and a polarization field can be used for exhausting background carriers of the two-dimensional semiconductor, enhancing the photoconductive effect of the two-dimensional semiconductor, and improving responsivity, detectivity, photoresponse time of the two-dimensional semiconductor; and in a mid- to long-wave infrared waveband, the ferroelectric material is transformed into the function layer and can generate remarkable photoresponse to the incident light in such waveband based on the pyroelectric effect of the ferroelectric material, at this time, the two-dimensional conductor is the auxiliary layer and is used for reading a channel current change caused by the incident light, in one aspect, an internal temperature of a polarized ferroelectric material is changed under the irradiation of infrared light so as to cause that the size of polarization instantly changes, and in the other aspect, based on a characteristic that the two-dimensional semiconductor is sensitive to an interfacial electric field, the concentration of channel carriers of the two-dimensional semiconductor under the constraint of the polarization electric field simultaneously changes, and such current variable quantity can be read through an external source-drain bias voltage. Finally, under the irradiation of incident lights in different wavebands, the two-dimensional semiconductor and the ferroelectric material help each other to form multi-functional complementation and finally to achieve a high-sensitivity ultra-broad spectrum detector.

Ultra-broad spectrum response is achieved based on the multi-functional complementation of the two-dimensional semiconductor and the ferroelectric material, and such multi-functional complementation mainly includes functional complementation of two or more physical mechanisms selected from a group of the photoconductive effect and an interface-sensitive effect of the two-dimensional semiconductor, and a polarization effect and the pyroelectricity effect of the ferroelectric material.

BRIEF DESCRIPTION OF THE DRAWINGS

To describe the technical solutions in the embodiments of the present invention or in the prior art more clearly, the following briefly introduces the accompanying drawings required for describing the embodiments. Apparently, the accompanying drawings in the following description show merely some embodiments of the present invention, and a person of ordinary skill in the art may still derive other drawings from these accompanying drawings without creative efforts.

DETAILED DESCRIPTION OF THE ILLUSTRATED EMBODIMENTS

The following clearly and completely describes the technical solutions in the embodiments of the present invention with reference to the accompanying drawings in the embodiments of the present invention. Apparently, the described embodiments are merely a part rather than all of the embodiments of the present invention. All other embodiments obtained by a person of ordinary skill in the art based on the embodiments of the present invention without creative efforts shall fall within the protection scope of the present invention.

An objective of the present invention is to provide an ultra-broad spectrum detector integrated with functions of a two-dimensional semiconductor and a ferroelectric material capable of expanding a spectrum detection range.

To make the foregoing objective, features, and advantages of the present invention clearer and more comprehensible, the present invention is further described in detail below with reference to the accompanying drawings and specific embodiments.

Figure 1:
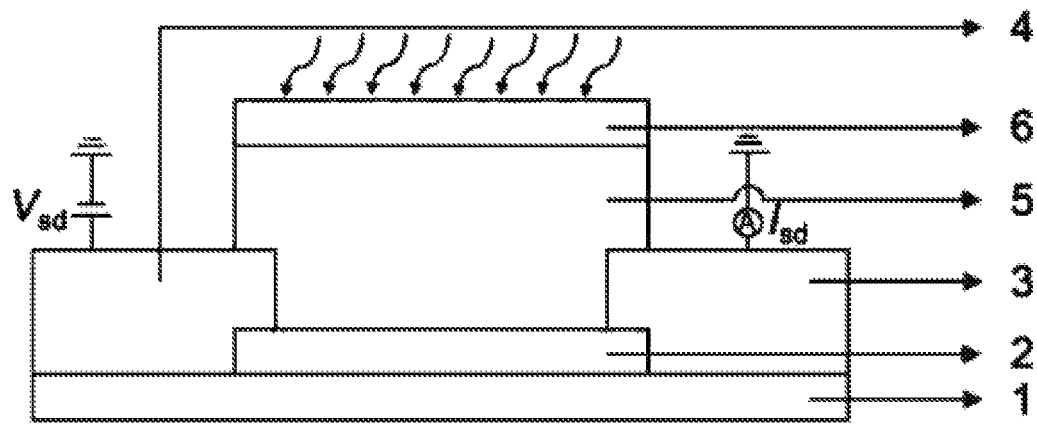
FIG. 1 is a structural sectional view of an ultra-broad spectrum detector integrated with functions of a two-dimensional semiconductor and a ferroelectric material provided by the present invention.

As shown in FIG. 1, an ultra-broad spectrum detector integrated with functions of a two-dimensional semiconductor and a ferroelectric material includes a substrate 1, a two-dimensional semiconductor 2, a source electrode 3, a drain electrode 4, a ferroelectric material 5 and a gate electrode 6;

the two-dimensional semiconductor 2, the source electrode 3 and the drain electrode 4 are arranged on an upper surface of the substrate 1, and the source electrode 3 and the drain electrode 4 are respectively arranged at two ends of an upper surface of the two-dimensional semiconductor 2;

the source electrode 3 and the drain electrode 4 includes an upper-layer metal and a lower-layer metal, and the upper-layer metal is thicker than the lower-layer metal;

two sides of the two-dimensional semiconductor 2 are respectively connected with the lower-layer metal of the source electrode 3 and the lower-layer metal of the drain electrode 4;

the ferroelectric material 5 is arranged on the upper surfaces of the two-dimensional semiconductor 2, the source electrode 3 and the drain electrode 4; and the lower surface of the gate electrode 6 is connected with the upper surface of the ferroelectric material 5.

To improve the sensitivity of an infrared waveband, a heat capacity of the substrate 1 needs to be reduced to a maximum extent, the substrate is an ultra-thin insulating substrate with a thickness thereof being less than 2 μm, and the substrate is used for supporting the two-dimensional semiconductor 2, the ferroelectric material 5 and the gate electrode 6.

The two-dimensional semiconductor 2 is a transition metal dichalcogenide semiconductor and specifically includes molybdenum disulfide, molybdenum diselenide, molybdenum ditelluride, tungsten disulfide and tungsten diselenide, and the two-dimensional semiconductor 2 has excellent photoconductivity characteristic in an ultraviolet to near infrared waveband and can be prepared by using techniques of mechanical exfoliation, chemical vapor deposition and the like.

The two-dimensional semiconductor 2 has one to ten layers of molecules.

The material of the source electrode 3 and the material of the drain electrode 4 are at least one of chromium, titanium, nickel, palladium, scandium, gold and platinum. The thickness of the lower-layer metal of the source electrode 3 is 5-15 nm, and the thickness of the upper-layer of the source electrode 3 is 30-50 nm.

The ferroelectric material 5 is a polyvinylidene fluoride organic ferroelectric polymer, and the thickness of the ferroelectric material 5 is 300-1200 nm.

The gate electrode 6 is a high-light-transmittance ultra-thin metal film and includes one of aluminum, chromium, titanium and nickel, a light transmittance of the gate electrode 6 in an ultraviolet to long-wave infrared waveband is greater than 50%, and the thickness of the gate electrode 6 is 7-10 nm.

Embodiment 1

An ultra-broad spectrum detector integrated with functions of a two-dimensional semiconductor and a ferroelectric material is provided in the present embodiment, and a structural section of the detector is shown in FIG. 1.

The detector includes a substrate 1, a two-dimensional semiconductor 2, a source electrode 3, a drain electrode 4, a ferroelectric material 5 and a gate electrode 6 sequentially from bottom to top.

In Embodiment 1, the substrate 1 is an ultra-thin polyimide film with a thickness thereof being 1.7 μm; the two-dimensional semiconductor 2 is $MoS_2$ with a few layers, and the thickness of which is equal to a total thickness of three layers; the metal material of the source electrode 3 and the metal material of the drain electrode 4 are chromium/gold (Cr/Au), the thickness of Cr is 15 nm, and the thickness of Au is 50 nm; the ferroelectric material 5 is poly(vinylidene-fluoride-trifluoroethylene) (P(VDF-TrFE)), the thickness of the ferroelectric material is 300 nm; and the gate electrode 6 is ultra-thin aluminum (Al) with a thickness thereof being 8 nm. Before a photoelectric test is conducted, a gate voltage of −40 V is applied to the gate electrode of the detector for 2 s, and then the gate voltage is removed such that the P(VDF-TrFE) can be polarized upwards and generate a certain remnant polarization electric field. Next the source electrode and the drain electrode are wired to conduct the photoelectric test, where a light working state schematic diagram is shown in FIG. 1, and at this time, only a small bias voltage needs to be applied to two ends of the source electrode and the drain electrode to be used for reading a channel current change.

Figure 2:
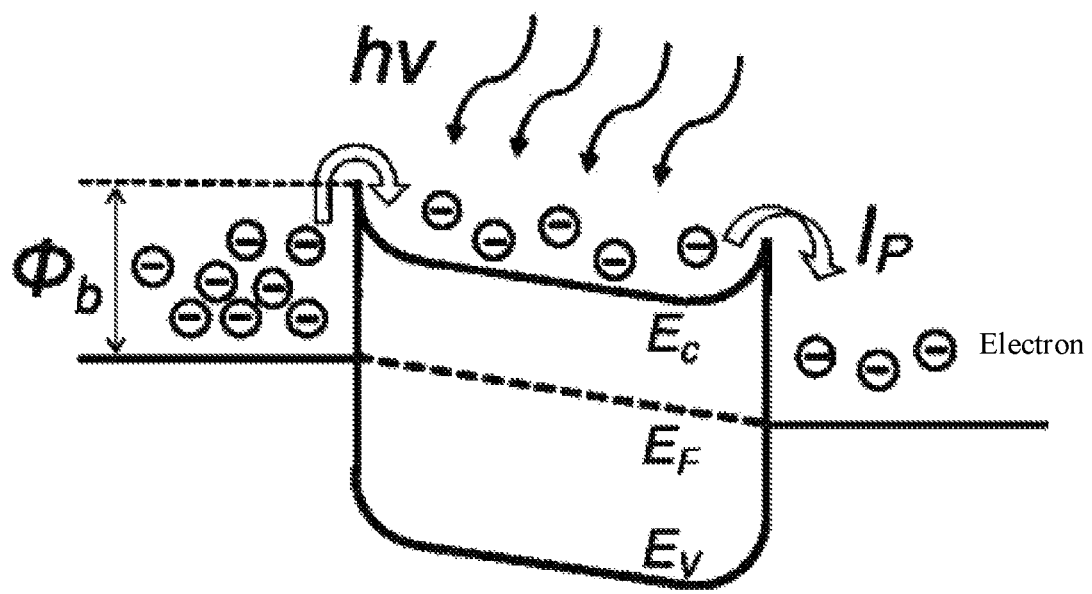
FIG. 2 is a schematic diagram of an ultra-broad spectrum detector integrated with functions of a two-dimensional semiconductor and a ferroelectric material provided by the present invention in an ultraviolet to near infrared waveband.

In FIG. 2, $\Phi_b$ is a barrier height difference between the source/drain electrode and the two-dimensional conductor material, $E_C$ is a conduction band of the two-dimensional semiconductor material, $E_F$ is a Fermi level of the two-dimensional semiconductor material, $E_V$ is a valence band of the two-dimensional semiconductor material, $h_v$ is energy of an incident light, and $I_P$ is photocurrent.

FIG. 2 describes detection mechanisms of the detector in an ultraviolet to near infrared waveband by using a schematic diagram of an energy band structure of the $MoS_2$. Under the action of an upward polarization electric field, the Fermi level of the $MoS_2$ is reduced, the barrier height difference between the source/drain electrode and the two-dimensional semiconductor channel is increased such that most of carriers are prevented from flowing through the channel, thereby effectively reducing dark current of the device. At this time, under the irradiation of incident light in the ultraviolet to near infrared waveband, and based on the photoconductive effect of the $MoS_2$, a large amount of photo-generated carriers are generated to cross a barrier and flow through the channel so as to form the photocurrent, so, the detector has the characteristics of low dark current, a high photocurrent switching on/off ratio, high detectivity, high responsivity, fast photo-response speed and the like when working in the ultraviolet to near infrared waveband.

Figure 3:
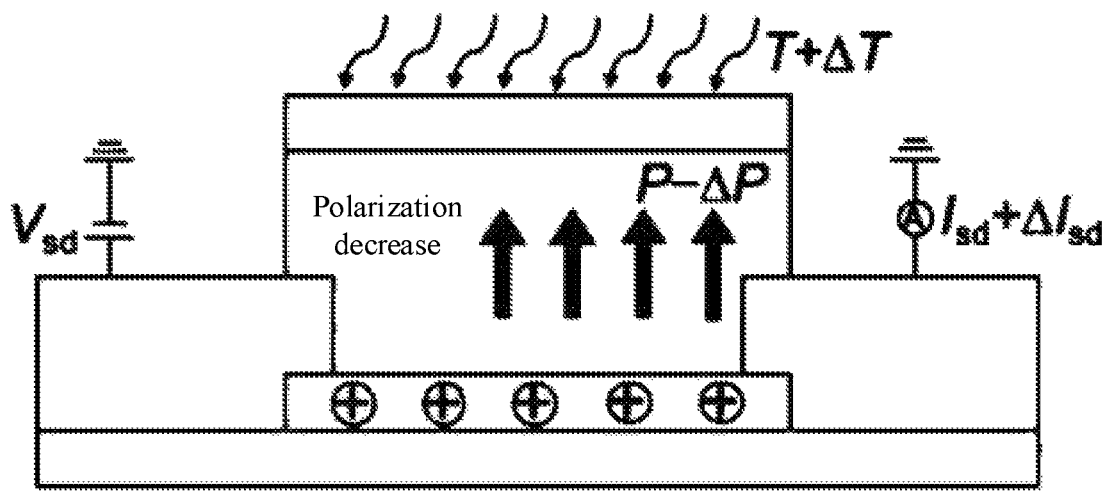
FIG. 3 is a schematic diagram of an ultra-broad spectrum detector integrated with functions of a two-dimensional semiconductor and a ferroelectric material provided by the present invention in a mid- to long-wave infrared waveband.
Figure 4:
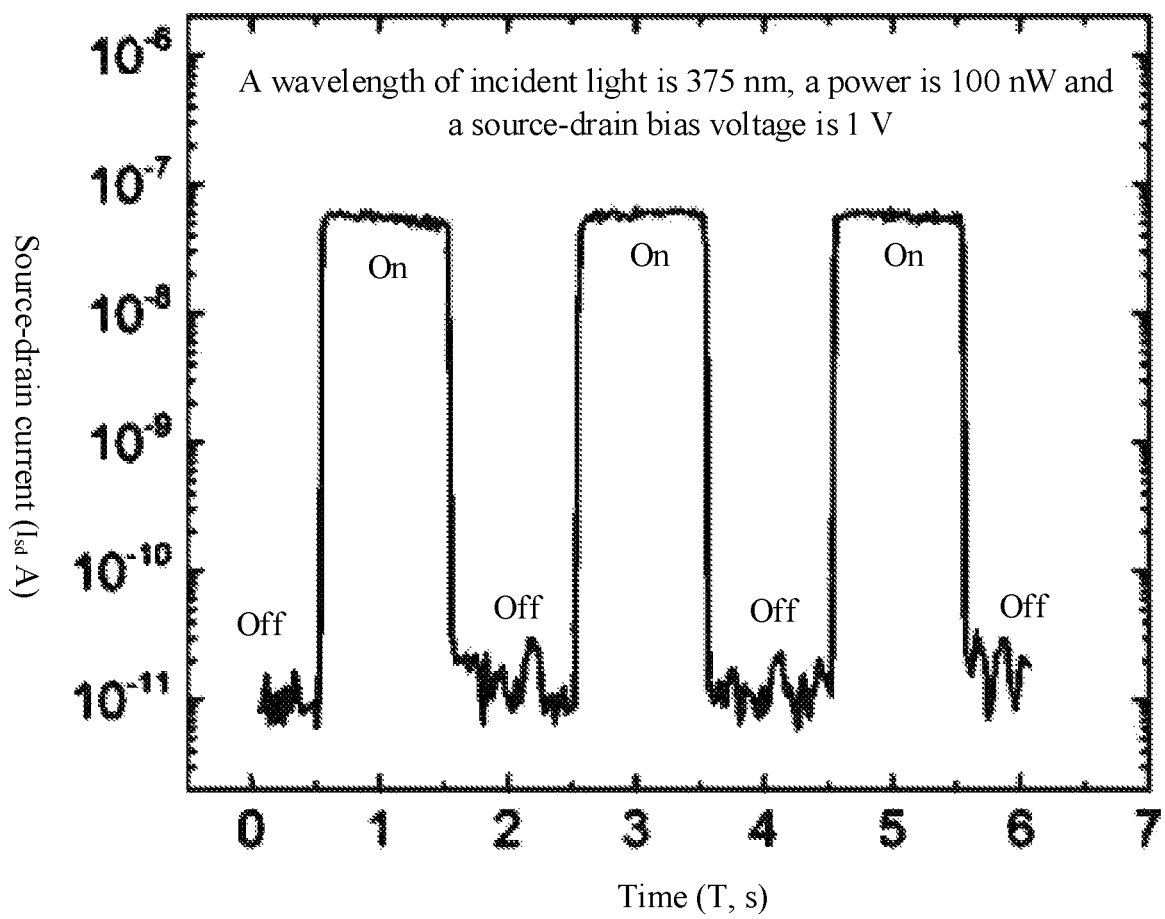
FIG. 4 is a diagram showing a photocurrent switching characteristic of a device when a wavelength of incident light is 375 nm, a power is 100 nW and a source-drain bias voltage is 1 V, provided in Embodiment 1.
Figure 5:
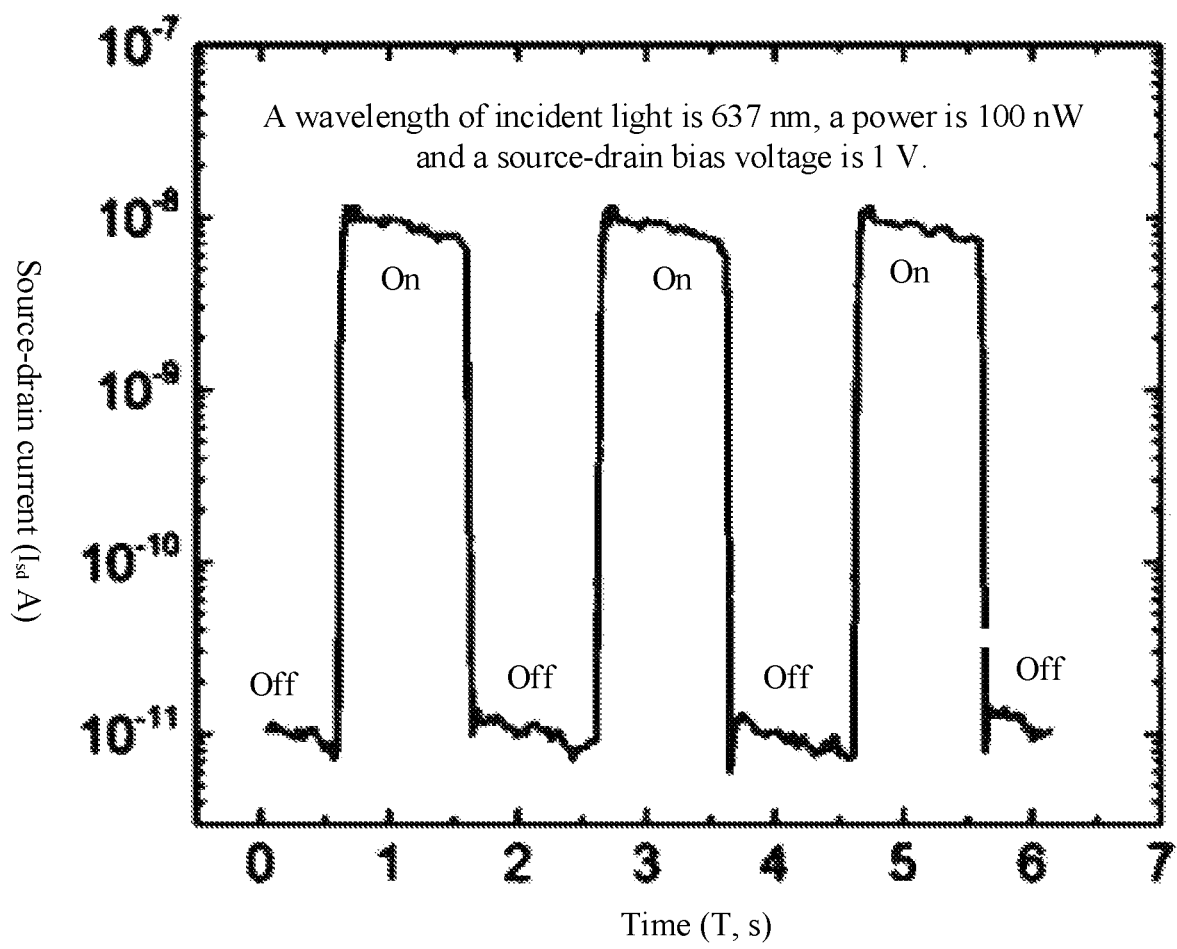
FIG. 5 is a diagram showing a photocurrent switching characteristic of a device when a wavelength of incident light is 637 nm, a power is 100 nW and a source-drain bias voltage is 1 V, provided in Embodiment 1.
Figure 6:
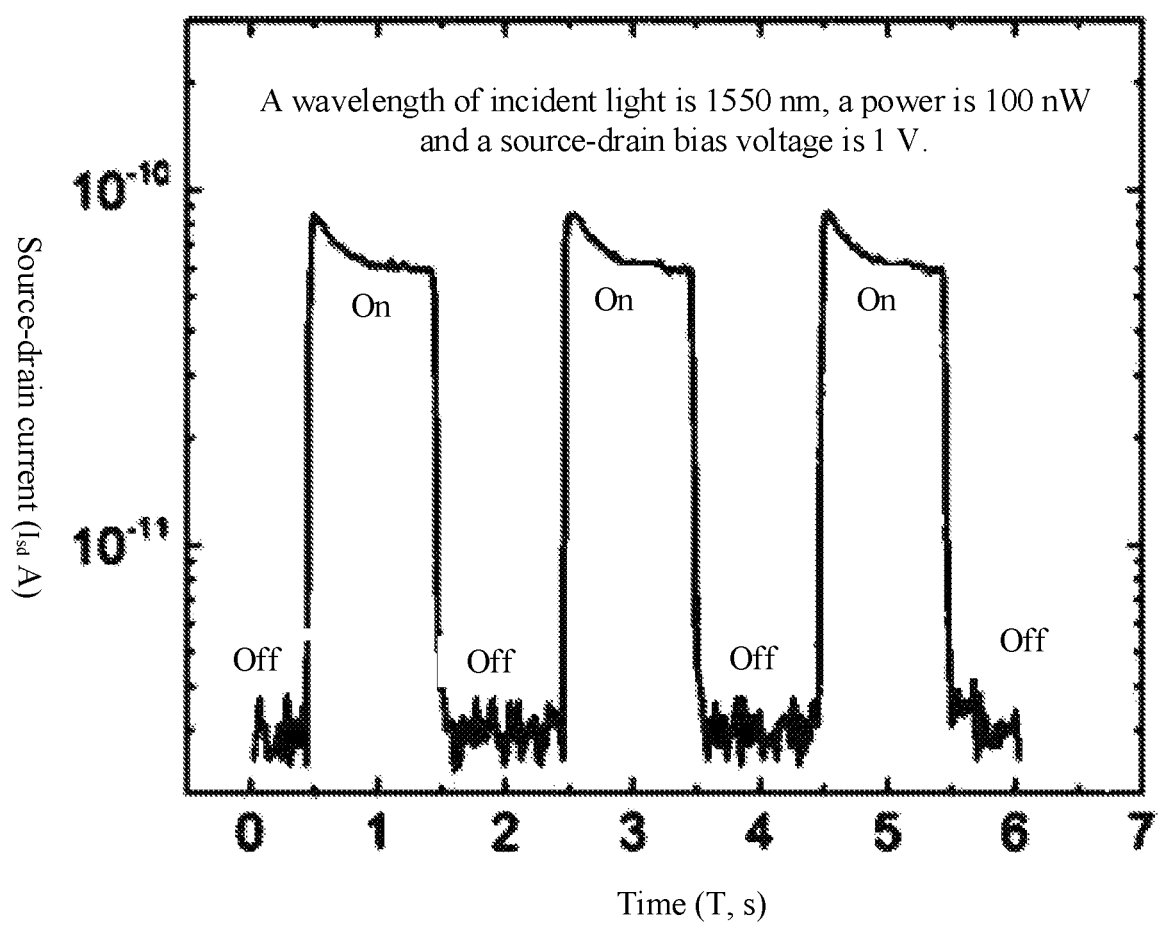
FIG. 6 is a diagram showing a photocurrent switching characteristic of a device when a wavelength of incident light is 1550 nm, a power is 100 nW and a source-drain bias voltage is 1 V, provided in Embodiment 1.
Figure 7:
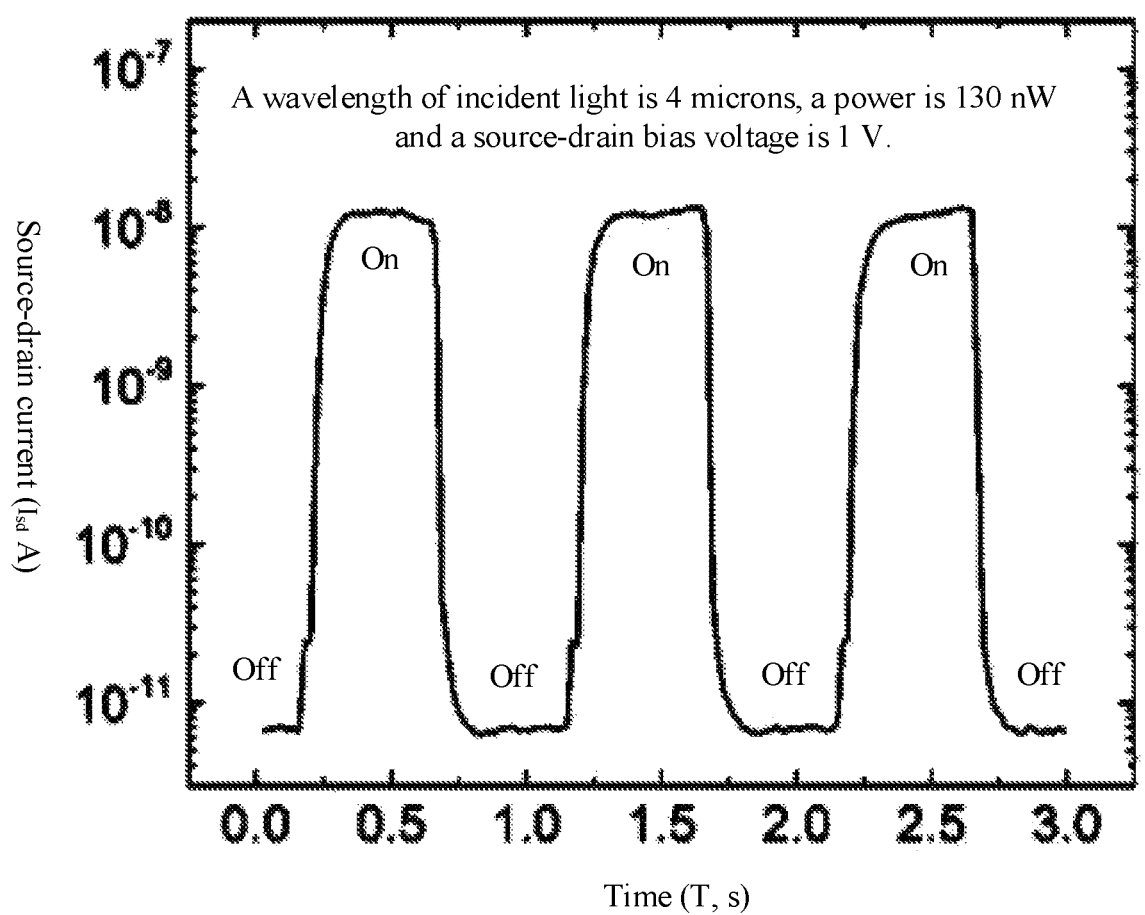
FIG. 7 is a diagram showing a photocurrent switching characteristic of a device when a wavelength of incident light is 4 μm, a power is 130 nW and a source-drain bias voltage is 1 V, provided in Embodiment 1.
Figure 8:
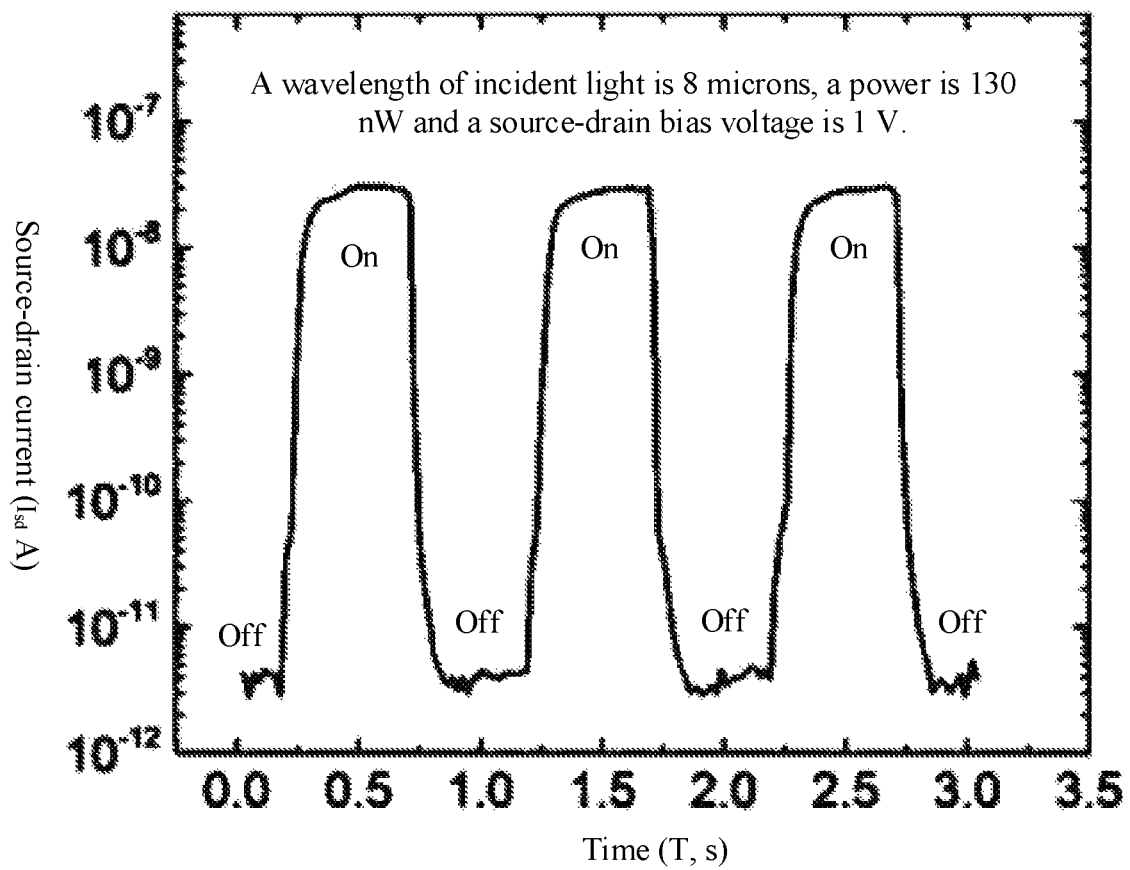
FIG. 8 is a diagram showing a photocurrent switching characteristic of a device when a wavelength of incident light is 8 μm, a power is 130 nW and a source-drain bias voltage is 1 V, provided in Embodiment 1.
Figure 9:
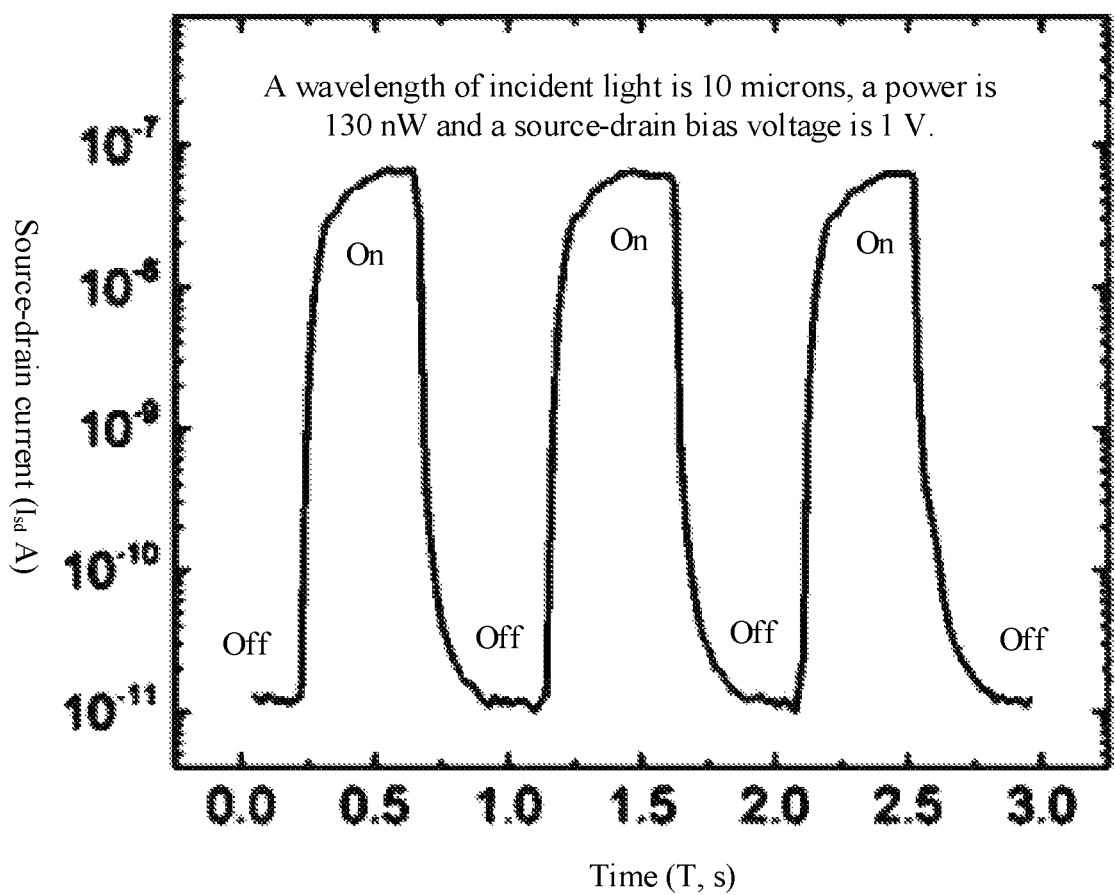
FIG. 9 is a diagram showing a photocurrent switching characteristic of a device when a wavelength of incident light is 10 μm, a power is 130 nW and a source-drain bias voltage is 1 V, provided in Embodiment 1.
Figure 10:
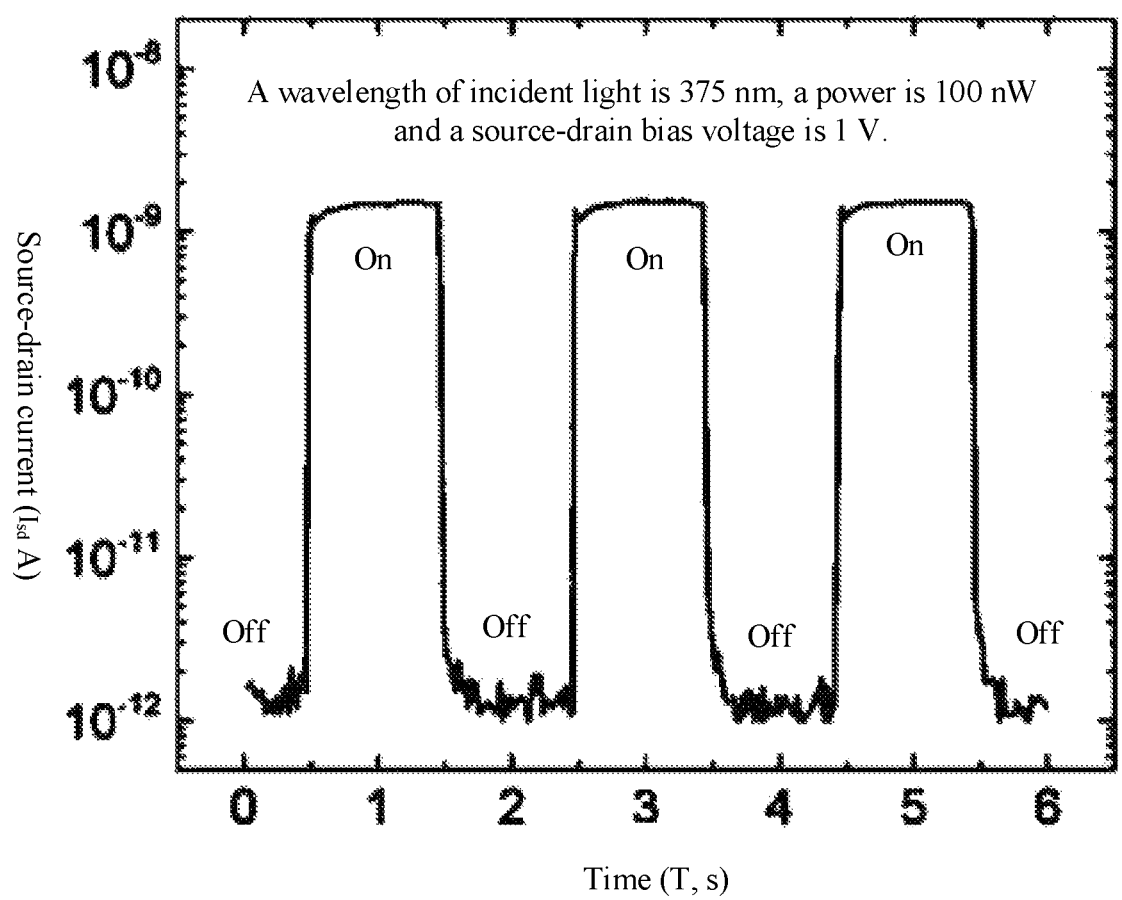
FIG. 10 is a diagram showing a photocurrent switching characteristic of a device when a wavelength of incident light is 375 nm, a power is 100 nW and a source-drain bias voltage is 1 V, provided in Embodiment 2.
Figure 11:
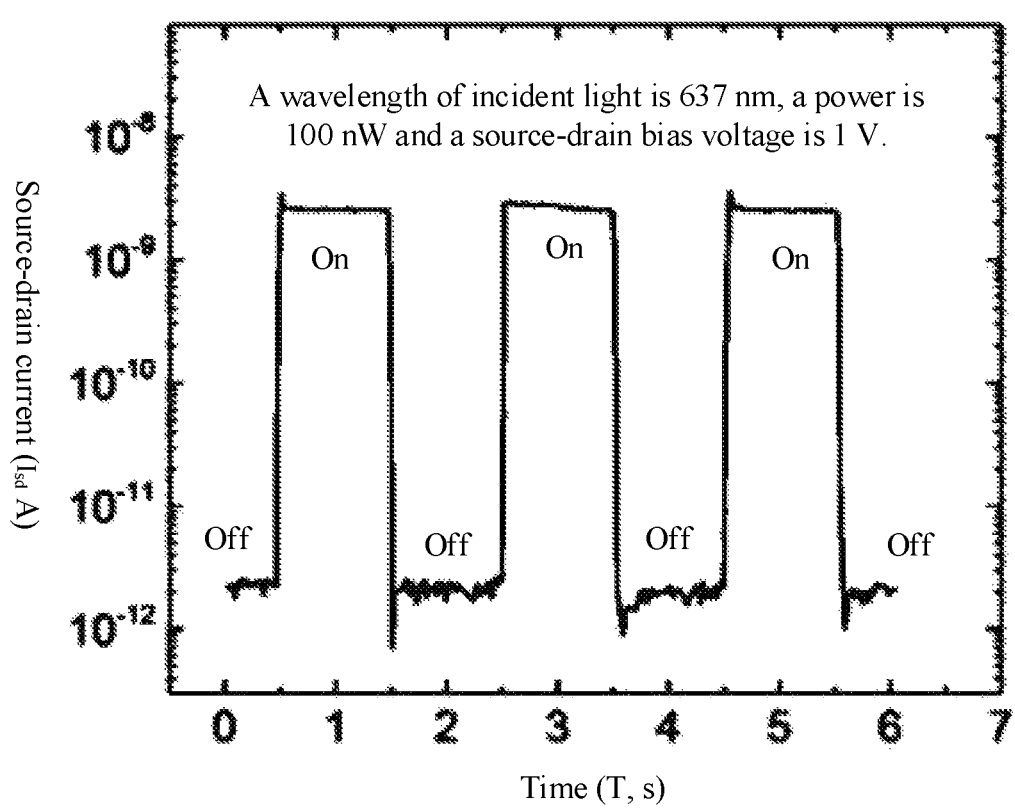
FIG. 11 is a diagram showing a photocurrent switching characteristic of a device when a wavelength of incident light is 637 nm, a power is 100 nW and a source-drain bias voltage is 1 V, provided in Embodiment 2.
Figure 12:
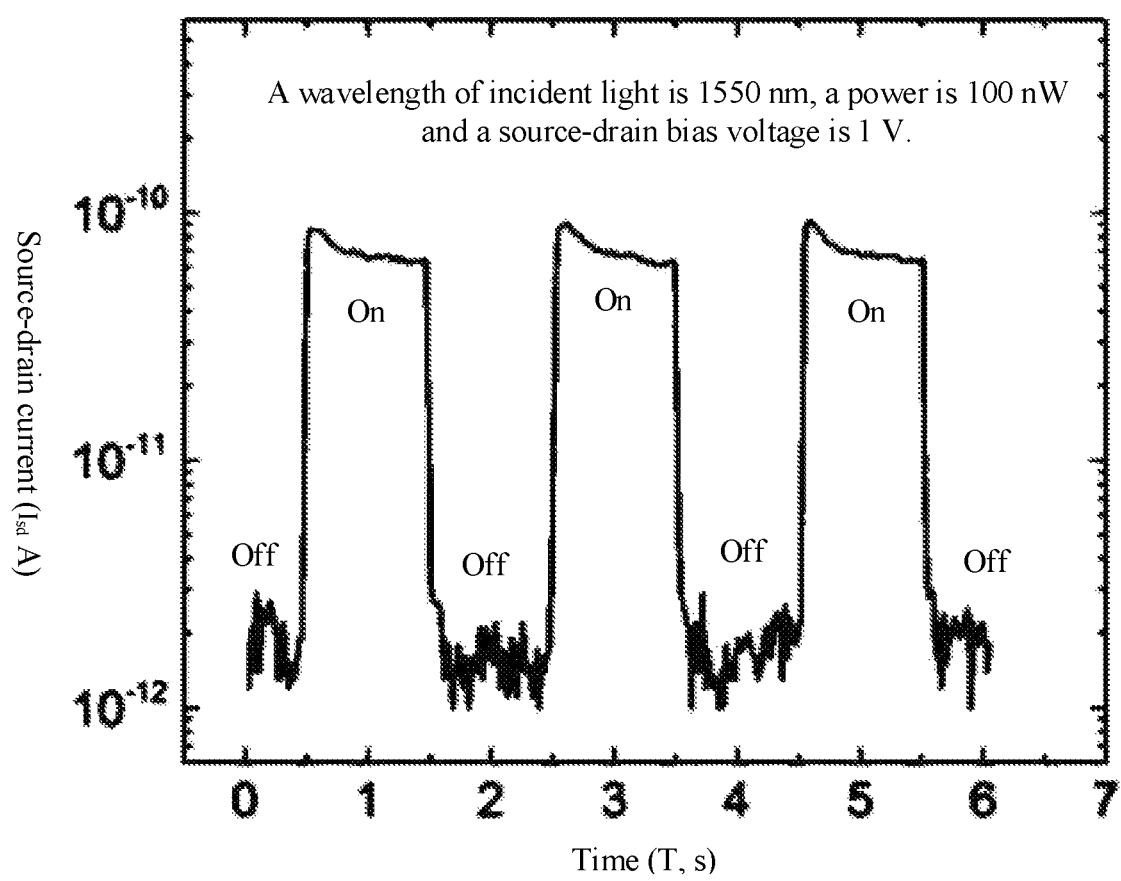
FIG. 12 is a diagram showing a photocurrent switching characteristic of a device when a wavelength of incident light is 1550 nm, a power is 100 nW and a source-drain bias voltage is 1 V, provided in Embodiment 2.
Figure 13:
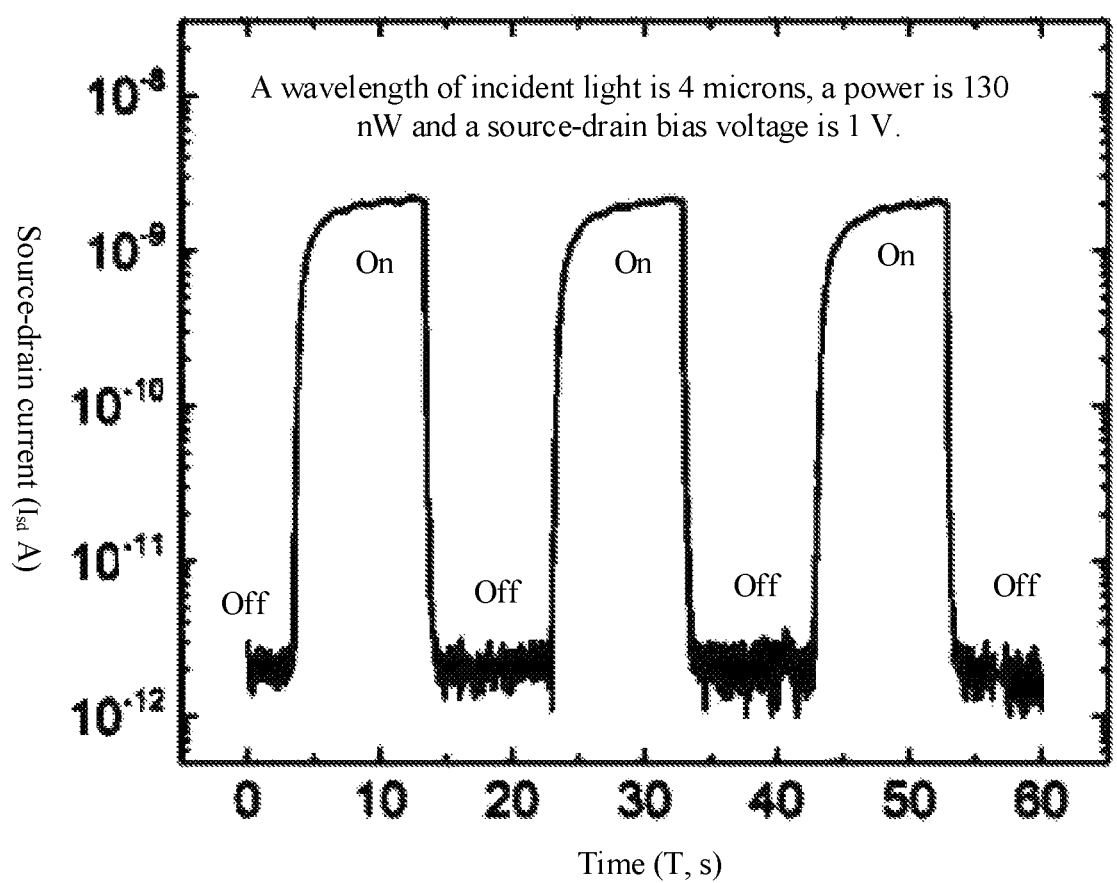
FIG. 13 is a diagram showing a photocurrent switching characteristic of a device when a wavelength of incident light is 4 μm, a power is 130 nW and a source-drain bias voltage is 1 V, provided in Embodiment 2.
Figure 14:
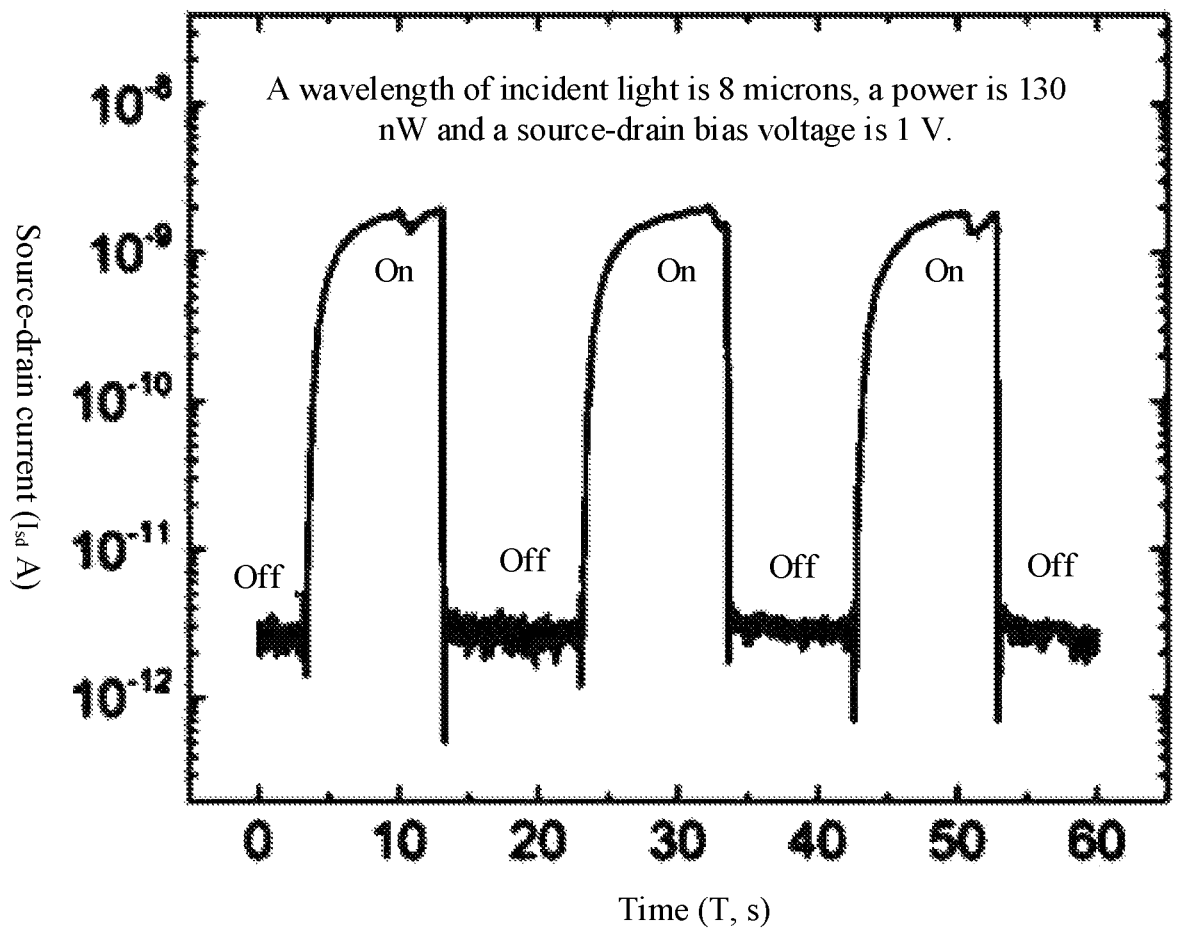
FIG. 14 is a diagram showing a photocurrent switching characteristic of a device when a wavelength of incident light is 8 μm, a power is 130 nW and a source-drain bias voltage is 1 V, provided in Embodiment 2.
Figure 15:
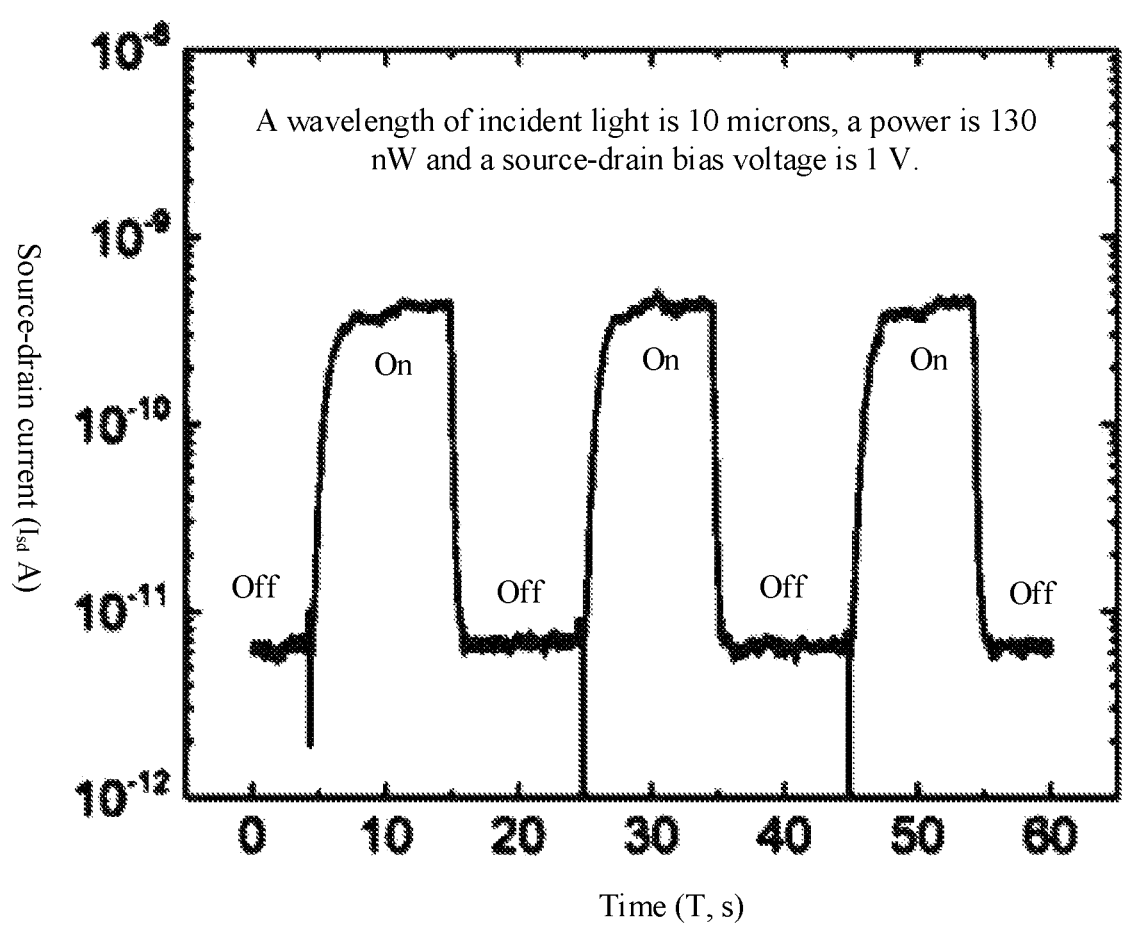
FIG. 15 is a diagram showing a photocurrent switching characteristic of a device when a wavelength of incident light is 10 μm, a power is 130 nW and a source-drain bias voltage is 1 V, provided in Embodiment 2.
Figure 16:
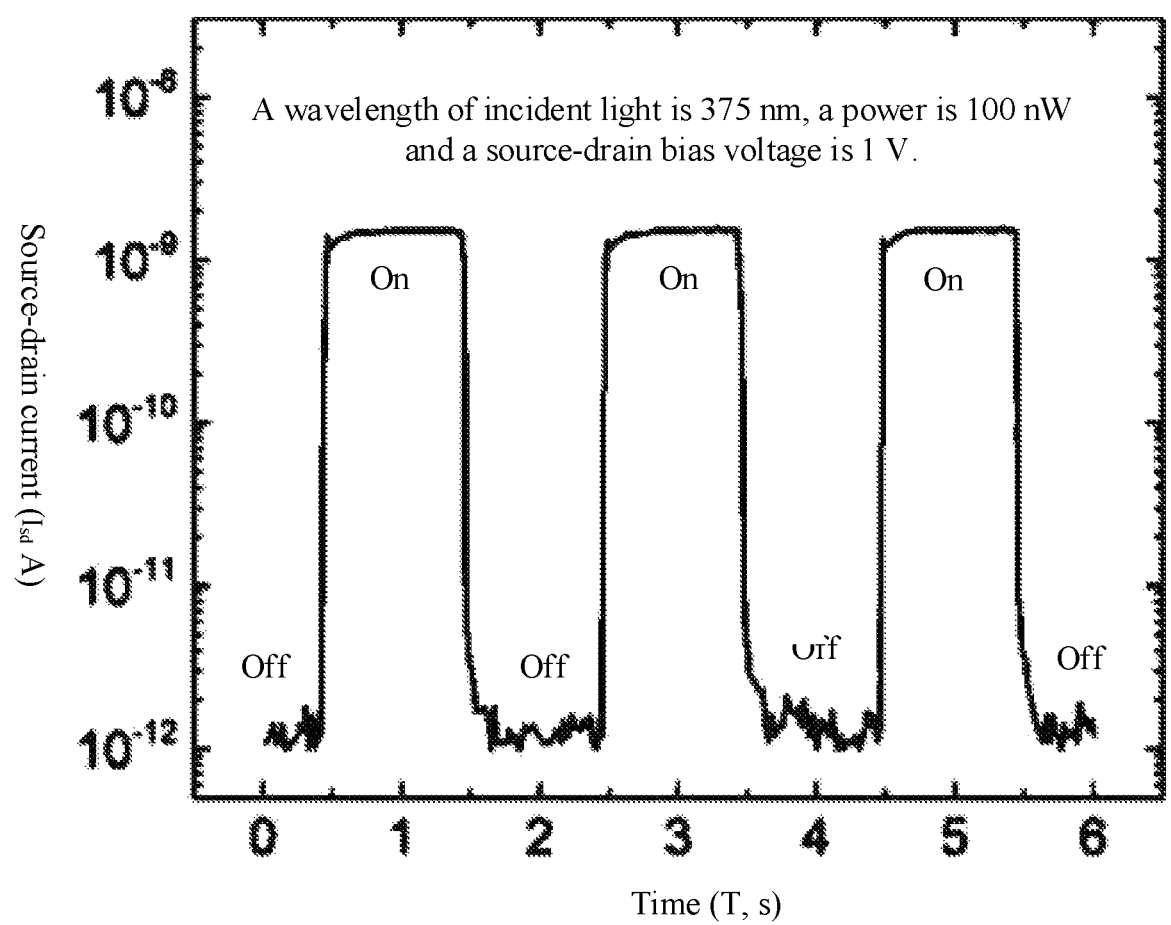
FIG. 16 is a diagram showing a photocurrent switching characteristic of a device when a wavelength of incident light is 375 nm, a power is 100 nW and a source-drain bias voltage is 1 V, provided in Embodiment 3.
Figure 17:
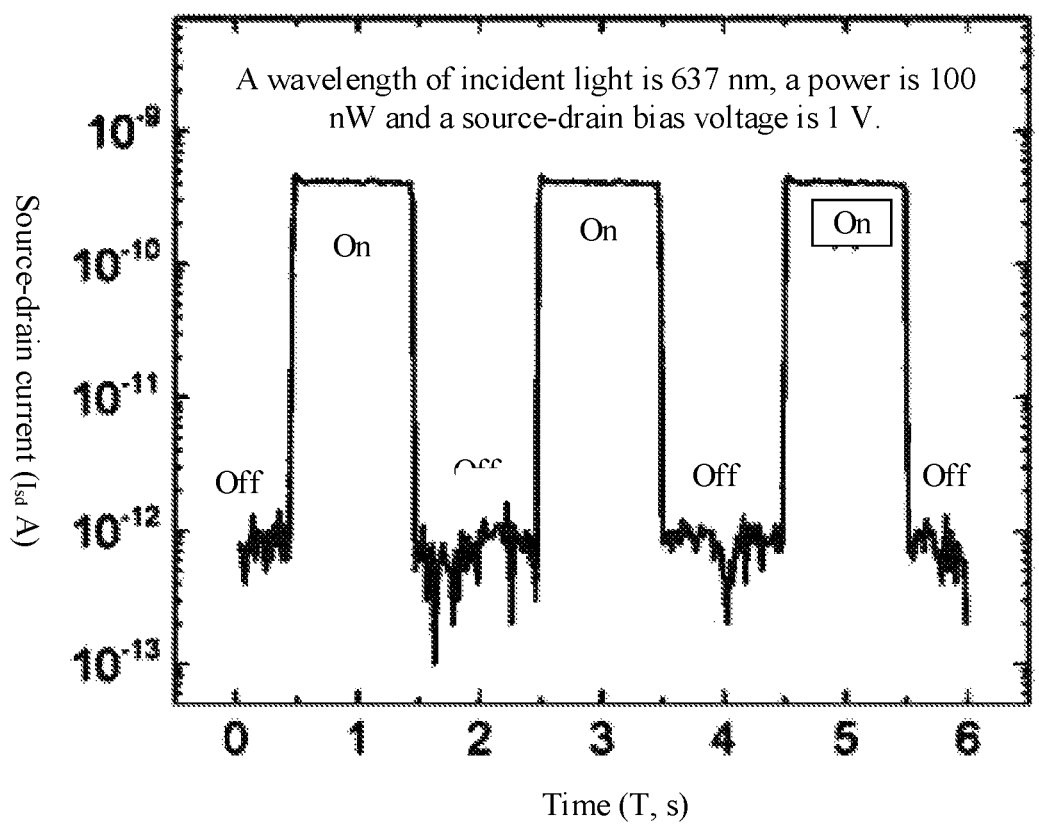
FIG. 17 is a diagram showing a photocurrent switching characteristic of a device when a wavelength of incident light is 637 nm, a power is 100 nW and a source-drain bias voltage is 1 V, provided in Embodiment 3.
Figure 18:
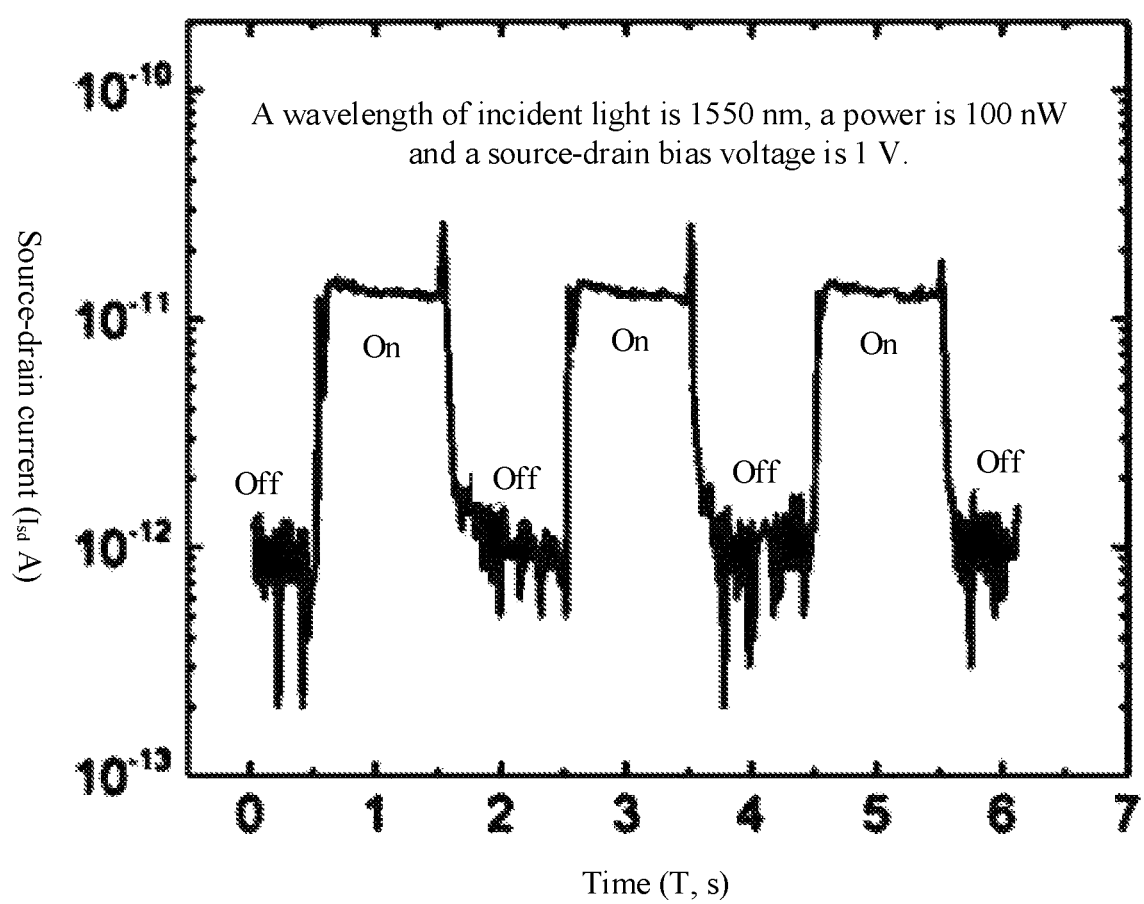
FIG. 18 is a diagram showing a photocurrent switching characteristic of a device when a wavelength of incident light is 1550 nm, a power is 100 nW and a source-drain bias voltage is 1 V, provided in Embodiment 3.
Figure 19:
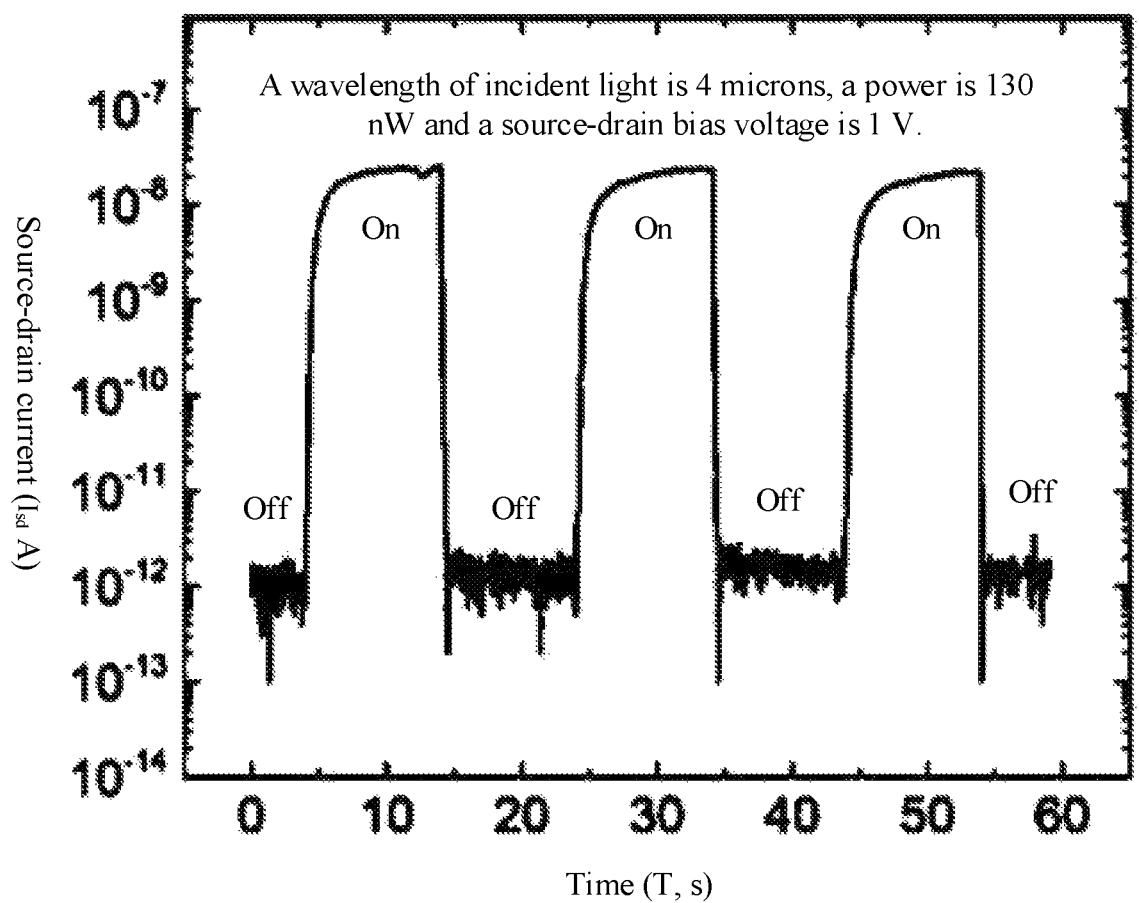
FIG. 19 is a diagram showing a photocurrent switching characteristic of a device when a wavelength of incident light is 4 μm, a power is 130 nW and a source-drain bias voltage is 1 V, provided in Embodiment 3.
Figure 20:
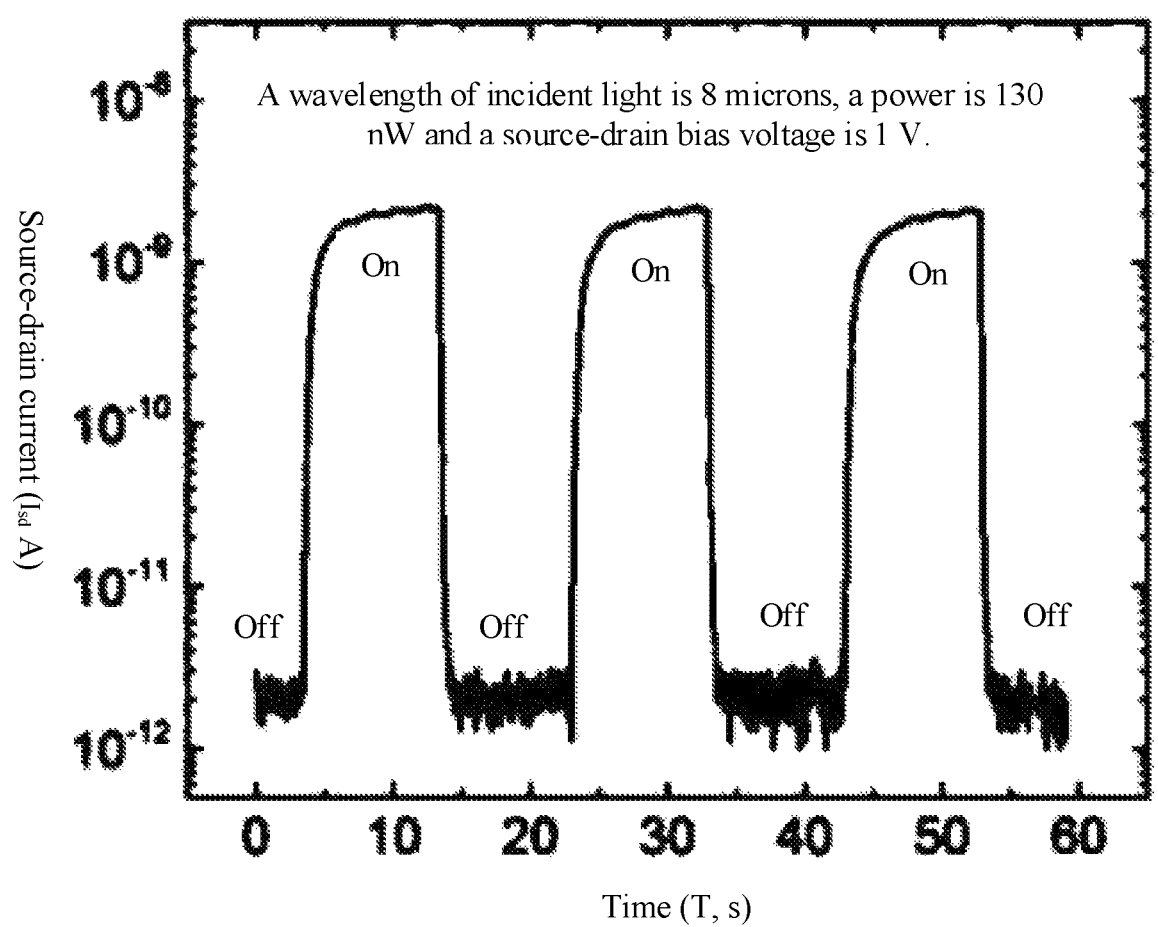
FIG. 20 is a diagram showing a photocurrent switching characteristic of a device when a wavelength of incident light is 8 μm, a power is 130 nW and a source-drain bias voltage is 1 V, provided in Embodiment 3.
Figure 21:
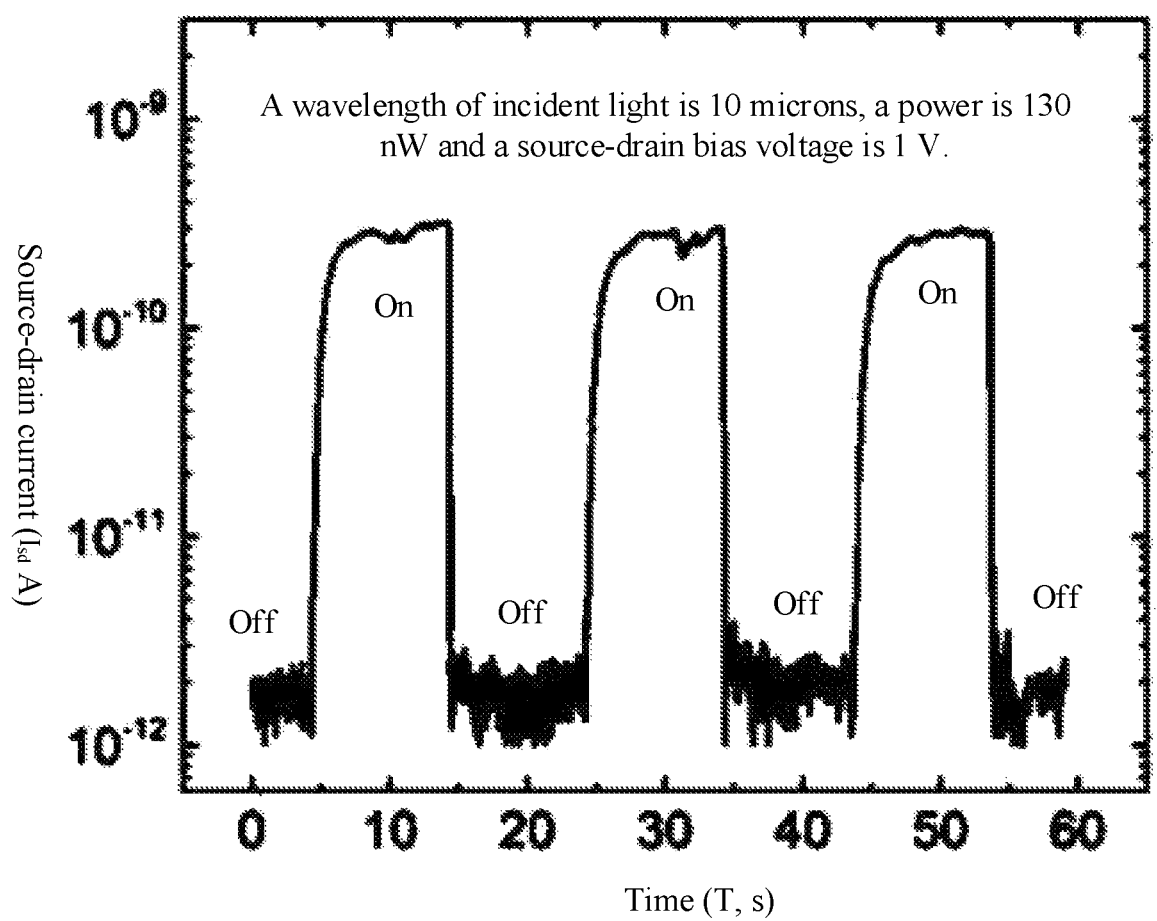
FIG. 21 is a diagram showing a photocurrent switching characteristic of a device when a wavelength of incident light is 10 μm, a power is 130 nW and a source-drain bias voltage is 1 V, provided in Embodiment 3.

FIG. 3 describes detection mechanisms of the detector in a mid- to long-wave infrared waveband by utilizing a characteristic that the polarization intensity of the P(VDF-TrFE) is sensitive to infrared light. Firstly, under the regulation of a P(VDF-TrFE) polarization electric field, a channel of $MoS_2$ can be always in a low current state; secondly, based on a pyroelectricity effect of the P(VDF-TrFE), and under the irradiation of the incident light in the mid- to long-wave infrared waveband, the polarization intensity the P(VDF-TrFE) is reduced with the increase of the internal temperature to cause that the concentration of carriers in the $MoS_2$ and the Fermi level of the $MoS_2$ are also changed, so the channel current is increased. Therefore, the sensitivity of the detector in the mid- to long-wave infrared waveband can be effectively improved with the aid of a characteristic that the $MoS_2$ is sensitive to an interfacial electric field.

Photoresponse results of the ultra-broad spectrum detector integrated with functions of a two-dimensional semiconductor and a ferroelectric material in the embodiment in the ultraviolet to long-wave infrared waveband are shown in FIG. 4 to FIG. 9. It can be seen that the detector has a remarkable photocurrent switching characteristic under the irradiation of monochromatic light from 375 nm to 10 μm based on the multi-functional complementation of the $MoS_2$ and the P(VDF-TrFE).

Embodiment 2

An ultra-broad spectrum detector integrated with functions of a two-dimensional semiconductor and a ferroelectric material is provided in the present embodiment, and a structural section and a working state schematic diagram of the detector are shown in FIG. 1.

The detector includes a substrate 1, a two-dimensional semiconductor 2, a source electrode 3, a drain electrode 4, a ferroelectric material 5 and a gate electrode 6 sequentially from bottom to top.

In the present embodiment, the substrate 1 is an ultra-thin polyimide film with a thickness thereof being 1.5 μm; the two-dimensional semiconductor 2 is $MoS_2$ with a few layers, and the thickness of which is equal to the thickness of one layer; the metal material of the source electrode 3 and the metal material of the drain electrode 4 are chromium/gold (Cr/Au), the thickness of Cr is 5 nm, and the thickness of Au is 40 nm; the ferroelectric material 5 is poly(vinylidenefluoride-trifluoroethylene) (P(VDF-TrFE)), the thickness of the ferroelectric material is 800 nm; and the gate electrode 6 is ultra-thin aluminum (Al) with a thickness thereof being 7 nm. Before a photoelectric test is conducted, a gate voltage of −100 V is applied to the gate electrode of the detector for 2 s, and then the gate voltage is removed such that the P(VDF-TrFE) can be polarized upwards and generate a certain remnant polarization electric field. Next the source electrode and the drain electrode are wired to conduct the photoelectric test, where a light working state schematic diagram is shown in FIG. 1, and at this time, only a small bias voltage needs to be applied to two ends of the source electrode and the drain electrode to be used for reading a channel current change.

FIG. 2 describes detection mechanisms of the detector in an ultraviolet to near infrared waveband by using a schematic diagram of an energy band structure of the $MoS_2$. Under the action of an upward polarization electric field, the Fermi level of the $MoS_2$ is reduced, the barrier height difference between the source/drain electrode and a two-dimensional semiconductor channel is increased such that most of carriers are prevented from flowing through the channel, thereby effectively reducing dark current of the device. At this time, under the irradiation of incident light in the ultraviolet to near infrared waveband, and based on the photoconductive effect of the $MoS_2$, a large amount of photo-generated carriers are generated to cross a barrier and flow through the channel so as to form the photocurrent, so, the detector has the characteristics of low dark current, a high photocurrent switching on/off ratio, high detectivity, high responsivity, fast photo-response speed and the like when working in the ultraviolet to near infrared waveband.

FIG. 3 describes detection mechanisms of the detector in a mid- to long-wave infrared waveband by utilizing a characteristic that the polarization intensity of the P(VDF-TrFE) is sensitive to infrared light. Firstly, under the regulation of a P(VDF-TrFE) polarization electric field, a channel of $MoS_2$ can be always in a low current state; secondly, based on a pyroelectricity effect of the P(VDF-TrFE), and under the irradiation of the incident light in the mid- to long-wave infrared waveband, the polarization intensity the P(VDF-TrFE) is reduced with the increase of the internal temperature to cause that the concentration of carriers in the $MoS_2$ and the Fermi level of the $MoS_2$ are also changed, so the channel current is increased. Therefore, the sensitivity of the detector in the mid- to long-wave infrared waveband can be effectively improved with the aid of a characteristic that the $MoS_2$ is sensitive to an interfacial electric field.

Photoresponse results of the ultra-broad spectrum detector integrated with functions of a two-dimensional semiconductor and a ferroelectric material in the embodiment in the ultraviolet to long-wave infrared waveband are shown in FIG. 10 to FIG. 15. It can be seen that the detector has a remarkable photocurrent switching characteristic under the irradiation of monochromatic light from 375 nm to 10 μm based on the multi-functional complementation of the $MoS_2$ and the P(VDF-TrFE).

Embodiment 3

An ultra-broad spectrum detector integrated with functions of a two-dimensional semiconductor and a ferroelectric material is provided in the present embodiment and is shown in FIG. 1.

The detector includes a substrate 1, a two-dimensional semiconductor 2, a ferroelectric material 5 and a gate electrode 6 sequentially from bottom to top, where a source electrode 3 and a drain electrode 4 are respectively arranged at two ends of the two-dimensional semiconductor.

In the present embodiment, the substrate 1 is an ultra-thin polyimide film with a thickness thereof being 2 μm; the two-dimensional semiconductor 2 is $MoS_2$ with a few layers, and the thickness of which is equal to a total thickness of ten layers; the metal material of the source electrode 3 and the metal material of the drain electrode 4 are chromium/gold (Cr/Au), the thickness of Cr is 10 nm, and the thickness of Au is 30 nm; the ferroelectric material 5 is poly(vinylidenefluoride-trifluoroethylene) (P(VDF-TrFE)), the thickness of the ferroelectric material is 1200 nm; and the gate electrode 6 is ultra-thin aluminum (Al) with a thickness thereof being 10 nm.

As shown in FIG. 1, in an ultraviolet to near infrared waveband, the two-dimensional semiconductor is a function layer and can generate remarkable photoresponse to incident light in such waveband based on a photoconductive effect of the two-dimensional semiconductor, the ferroelectric material is an auxiliary layer, and its polarization characteristic is used for enhancing the photoconductive effect of the two-dimensional semiconductor, and improving responsivity, detectivity, photoresponse time of the two-dimensional semiconductor; and in a mid- to long-wave infrared waveband, the ferroelectric material is transformed into the function layer and can generate remarkable photoresponse to the incident light in such waveband based on a pyroelectric effect of the ferroelectric material, at this time, the two-dimensional conductor is the auxiliary layer and is used for reading a channel current change caused by the incident light, and based on a characteristic that the two-dimensional semiconductor is sensitive to an interfacial electric field, the sensitivity of the detector in the infrared waveband can be effectively improved. Before a photoelectric test is conducted, a gate voltage of −150 V is applied to the gate electrode of the detector for 2 s, and then the gate voltage is removed such that the P(VDF-TrFE) can be polarized upwards and generate a certain remnant polarization electric field. Next the source electrode and the drain electrode are wired to conduct the photoelectric test, where a photoelectric test schematic diagram is shown in FIG. 1, and at this time, only a small bias voltage needs to be applied to two ends of the source electrode and the drain electrode to be used for reading a channel current change.

FIG. 2 describes detection mechanisms of the detector in an ultraviolet to near infrared waveband by using a schematic diagram of an energy band structure of the $MoS_2$. Under the action of an upward polarization electric field, the Fermi level of the $MoS_2$ is reduced, the barrier height difference between the source/drain electrode and a two-dimensional semiconductor channel is increased such that most of carriers are prevented from flowing through the channel, thereby effectively reducing dark current of the device. At this time, under the irradiation of incident light in the ultraviolet to near infrared waveband, and based on the photoconductive effect of the $MoS_2$, a large amount of photo-generated carriers are generated to cross a barrier and flow through the channel so as to form the photocurrent, so, the detector has the characteristics of low dark current, a high photocurrent switching on/off ratio, high detectivity, high responsivity, fast photo-response time and the like when working in the ultraviolet to near infrared waveband.

FIG. 3 describes detection mechanisms of the detector in a mid- to long-wave infrared waveband by utilizing a characteristic that the polarization intensity of the P(VDF-TrFE) is sensitive to infrared light. Firstly, under the regulation of a P(VDF-TrFE) polarization electric field, a channel of $MoS_2$ can be always in a low current state; secondly, based on a pyroelectricity effect of the P(VDF-TrFE), and under the irradiation of the incident light in the mid- to long-wave infrared waveband, the polarization intensity the P(VDF-TrFE) is reduced with the increase of the internal temperature to cause that the concentration of carriers in the $MoS_2$ and the Fermi level of the $MoS_2$ are also changed, so the channel current is increased. Therefore, the sensitivity of the detector in the mid- to long-wave infrared waveband can be effectively improved with the aid of a characteristic that the $MoS_2$ is sensitive to an interfacial electric field.

Photoresponse results of the ultra-broad spectrum detector integrated with functions of a two-dimensional semiconductor and a ferroelectric material in the embodiment in the ultraviolet to long-wave infrared waveband are shown in FIG. 16 to FIG. 21. It can be seen that the detector has a remarkable photocurrent switching characteristic under the irradiation of monochromatic light from 375 nm to 10 μm based on the multi-functional complementation of the $MoS_2$ and the P(VDF-TrFE).

The beneficial effects of the present invention are:

in the ultraviolet to near infrared waveband, and based on the photoconductivity characteristic of the two-dimensional semiconductor, remarkable photoresponse to incident light in such waveband can be generated; and with the aid of remnant polarization electric field of the ferroelectric material, responsivity, detectivity, photo-response time and the like of the two-dimensional semiconductor are greatly improved; and in the mid- to long-wave infrared waveband, based on a pyroelectric effect of the ferroelectric material, remarkable photoresponse to the incident light in such waveband can be generated, the two-dimensional semiconductor as an auxiliary layer is used for reading a channel current change caused by the incident light, and the polarized ferroelectric material can effectively reduce the dark current, and after the ferroelectric material is irradiated by infrared light, the internal temperature changes to cause that the size of polarization instantly changes, and due to a characteristic that the two-dimensional semiconductor is sensitive to an interfacial electric field, the concentration of channel carriers of the two-dimensional semiconductor under the constraint of the polarization electric field simultaneously changes, so the channel current is remarkably changed.

Compared with the traditional two-dimensional semiconductor photodetector, the detector provided by the present invention has high responsivity, high detectivity, fast photo-response speed and a wide detection wavelength range.

Compared with the traditional infrared pyroelectric detector, the detector provided by the present invention simplifies a sensitive element and a corresponding readout circuit in the traditional pyroelectric detector unit to be a single transistor device so as to greatly optimize the structure, and also has high sensitivity and a wide detection wavelength range.

The ultra-broad spectrum response detector provided by the present invention only needs to apply a small source-drain bias voltage during working to be capable of completely meeting a low power consumption requirement.

The ultra-broad spectrum response detector provided by the present invention can be applied to the fields of two-color/multi-waveband detectors due to its response wavelength range covering an ultraviolet to long-wave infrared waveband.

Each embodiment of the present specification is described in a progressive manner, each embodiment focuses on the difference from other embodiments, and the same and similar parts between the embodiments may refer to each other. For a system disclosed in the embodiments, since it corresponds to the method disclosed in the embodiments, the description is relatively simple, and reference can be made to the method description.

Several examples are used for illustration of the principles and implementation methods of the present invention. The description of the embodiments is used to help illustrate the method and its core principles of the present invention. In addition, those skilled in the art can make various modifications in terms of specific embodiments and scope of application in accordance with the teachings of the present invention. In conclusion, the content of this specification shall not be construed as a limitation to the invention.

What is claimed is:

1. An ultra-broad spectrum detector integrated with functions of a two-dimensional semiconductor and a ferroelectric material, wherein the spectrum detector comprises a substrate (1), a two-dimensional semiconductor (2), a source electrode (3), a drain electrode (4), a ferroelectric material (5) and a gate electrode (6);
   the two-dimensional semiconductor (2), the source electrode (3) and the drain electrode (4) are arranged on an upper surface of the substrate (1), and the source electrode (3) and the drain electrode (4) are respectively arranged at two ends of an upper surface of the two-dimensional semiconductor (2);
   the source electrode (3) and the drain electrode (4) comprise an upper-layer metal and a lower-layer metal, and the upper-layer metal is thicker than the lower-layer metal;
   two sides of the two-dimensional semiconductor (2) are respectively connected with the lower-layer metal of the source electrode (3) and the lower-layer metal of the drain electrode (4);
   the ferroelectric material (5) is arranged on the upper surfaces of the two-dimensional semiconductor (2), the source electrode (3) and the drain electrode (4); and
   the lower surface of the gate electrode (6) is connected with the upper surface of the ferroelectric material (5); wherein:
   the substrate (1) is an ultra-thin insulating substrate with a thickness thereof being less than 2 µm; and
   the two-dimensional semiconductor (2) is a transition metal dichalcogenide semiconductor, and the two-dimensional semiconductor (2) has one to ten layers of molecules.

2. The ultra-broad spectrum detector integrated with functions of a two-dimensional semiconductor and a ferroelectric material according to claim 1, wherein the material of the source electrode (3) and the material of the drain electrode (4) are at least one of chromium, titanium, nickel, palladium, scandium, gold and platinum.

3. The ultra-broad spectrum detector integrated with functions of a two-dimensional semiconductor and a ferroelectric material according to claim 1, wherein the thickness of the lower-layer metal of the source electrode (3) is 5-15 nm, and the thickness of the upper-layer of the source electrode (3) is 30-50 nm.

4. The ultra-broad spectrum detector integrated with functions of a two-dimensional semiconductor and a ferroelectric material according to claim 1, wherein the ferroelectric material (5) is a polyvinylidene fluoride organic ferroelectric polymer, and the thickness of the ferroelectric material (5) is 300-1200 nm.

5. The ultra-broad spectrum detector integrated with functions of a two-dimensional semiconductor and a ferroelectric material according to claim 1, wherein the gate electrode (6) is a high-light-transmittance ultra-thin metal film and comprises one of aluminum, chromium, titanium and nickel, and a light transmittance of the gate electrode (6) in an ultraviolet to long-wave infrared waveband is greater than 50%.

* * * * *